US010863645B2

(12) United States Patent
Wu et al.

(10) Patent No.: US 10,863,645 B2
(45) Date of Patent: Dec. 8, 2020

(54) DUAL SERVER CHASSIS

(71) Applicant: LENOVO Enterprise Solutions (Singapore) PTE. LTD., New Tech Park (SG)

(72) Inventors: Morgan Wu, New Taipei (TW); Makoto Ono, Chapel Hill, NC (US); Wei Che Hsiao, Taipei (TW); Dragon Yu, Dali (TW)

(73) Assignee: LENOVO Enterprise Solutions (Singapore) PTE. LTD, Singapore (SG)

( * ) Notice: Subject to any disclaimer, the term of this patent is extended or adjusted under 35 U.S.C. 154(b) by 0 days.

(21) Appl. No.: 16/681,512

(22) Filed: Nov. 12, 2019

(65) Prior Publication Data

US 2020/0154592 A1 May 14, 2020

(30) Foreign Application Priority Data

Nov. 8, 2018 (CN) .......................... 2018 1 1324838

(51) Int. Cl.
*H05K 7/14* (2006.01)
*F16B 5/00* (2006.01)
(52) U.S. Cl.
CPC ......... *H05K 7/1489* (2013.01); *F16B 5/0012* (2013.01)
(58) Field of Classification Search
CPC .. H05K 5/0021; H05K 5/0204; H05K 7/1485; H05K 7/1487; H05K 7/1489; H05K 7/023; F16B 5/0012
See application file for complete search history.

(56) References Cited

U.S. PATENT DOCUMENTS

| 4,478,464 | A | * | 10/1984 | Williams | ........... | G11B 23/0236 |
|---|---|---|---|---|---|---|
| | | | | | | 206/387.14 |
| 6,597,576 | B1 | * | 7/2003 | Smith | ................. | H05K 7/20154 |
| | | | | | | 312/223.2 |
| 7,625,250 | B2 | * | 12/2009 | Blackwell | ............ | H05K 7/1425 |
| | | | | | | 439/717 |
| 9,851,764 | B2 | * | 12/2017 | Harvilchuck | ........... | G06F 1/185 |
| 2005/0024842 | A1 | * | 2/2005 | Warenczak | .......... | H05K 7/1425 |
| | | | | | | 361/826 |
| 2012/0234831 | A1 | * | 9/2012 | Lin | ....................... | H05K 7/1487 |
| | | | | | | 220/23.4 |
| 2017/0354050 | A1 | * | 12/2017 | Pedoeem | ............. | H05K 7/1487 |

FOREIGN PATENT DOCUMENTS

DE            9401567 U1 *   3/1994   ........... G09B 23/185

* cited by examiner

*Primary Examiner* — Andrew M Roersma
(74) *Attorney, Agent, or Firm* — Kunzler Bean & Adamson; Bruce R. Needham

(57) ABSTRACT

In another aspect, a server chassis is configured to mount to a server rack. The server chassis includes a first housing that includes a first sidewall, where the first housing is configured to mount to the server rack and house a first electronic component, and a second housing that includes a second sidewall, the second housing configured to mount to the server rack and house a second electronic component. The first housing includes a first bracket mounted to the first sidewall of the first housing, and the second housing includes a second bracket mounted to the second sidewall of the second housing. The second bracket of the second housing is engagable to the first bracket of the first housing to secure the first housing and the second housing to each other.

20 Claims, 12 Drawing Sheets

DUAL SERVER CHASSIS

CROSS-REFERENCE TO RELATED APPLICATIONS

This patent application claims priority to China Patent Application No. 201811324838.0 filed on Nov. 8, 2018 for Morgan Wu, the entire contents of which are incorporated herein by reference for all purposes.

FIELD

The subject matter disclosed herein relates to a server chassis and in particular, to a server chassis for mounting to a server rack.

BACKGROUND

Conventional computer server chassis are mounted to server racks via an enclosure into which at least two server chassis are fitted. The enclosure is fastened to the rack rails to secure the server chassis in position upon which operations of the computer servers are performed.

Computer server chassis of the above-mentioned type face challenges in selecting server components with best-available models, configurations and performances. In one example, as that specified under Electronic Industries Association, EIA, 310-D Standard, the server chassis has a maximum height restricted by the height clearance of the enclosure allowed to fit the server chassis in. In turn, the chassis height clearance remaining for receiving fan units is less than the height of a preferred fan model, i.e. 40 mm for high fan units.

It is therefore desirable to provide a mounting apparatus that allows selection of the preferred fan unit in server chassis for mounting to server racks according to the EIA-310-D Standard.

BRIEF SUMMARY

In one aspect, the present disclosure provides a server chassis for mounting to a server rack. The server chassis includes a first housing for receiving/housing a first computer server, a second housing for receiving/housing a second computer server, a first bracket mounted to a first sidewall of the first housing, and a second bracket mounted to a second sidewall of the second housing. The second bracket is engaged to the first bracket to secure the first housing and the second housing to each other, which is capable to be mounted to a server rack and in compliance with industrial standards.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
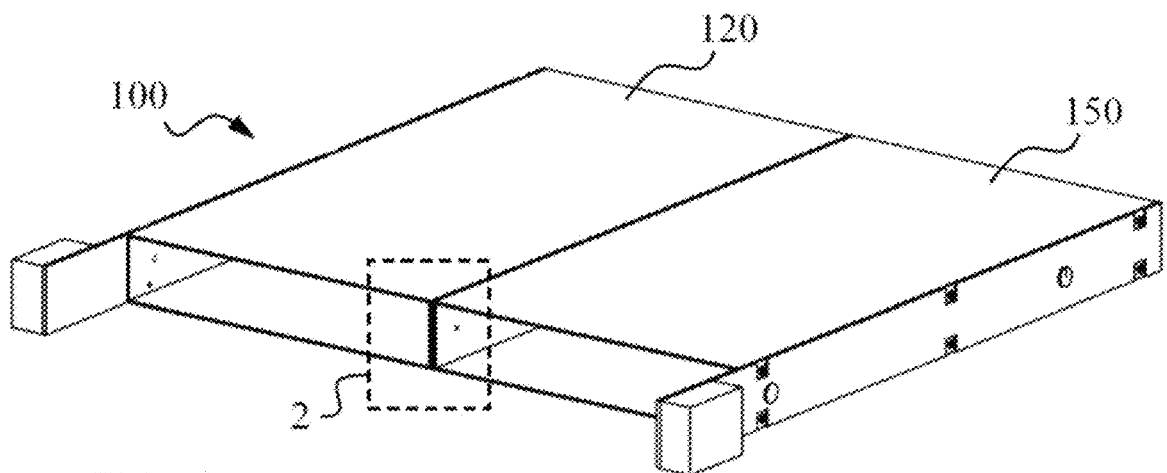
FIG. 1 is a perspective view showing a server chassis according to one embodiment.
Figure 2:
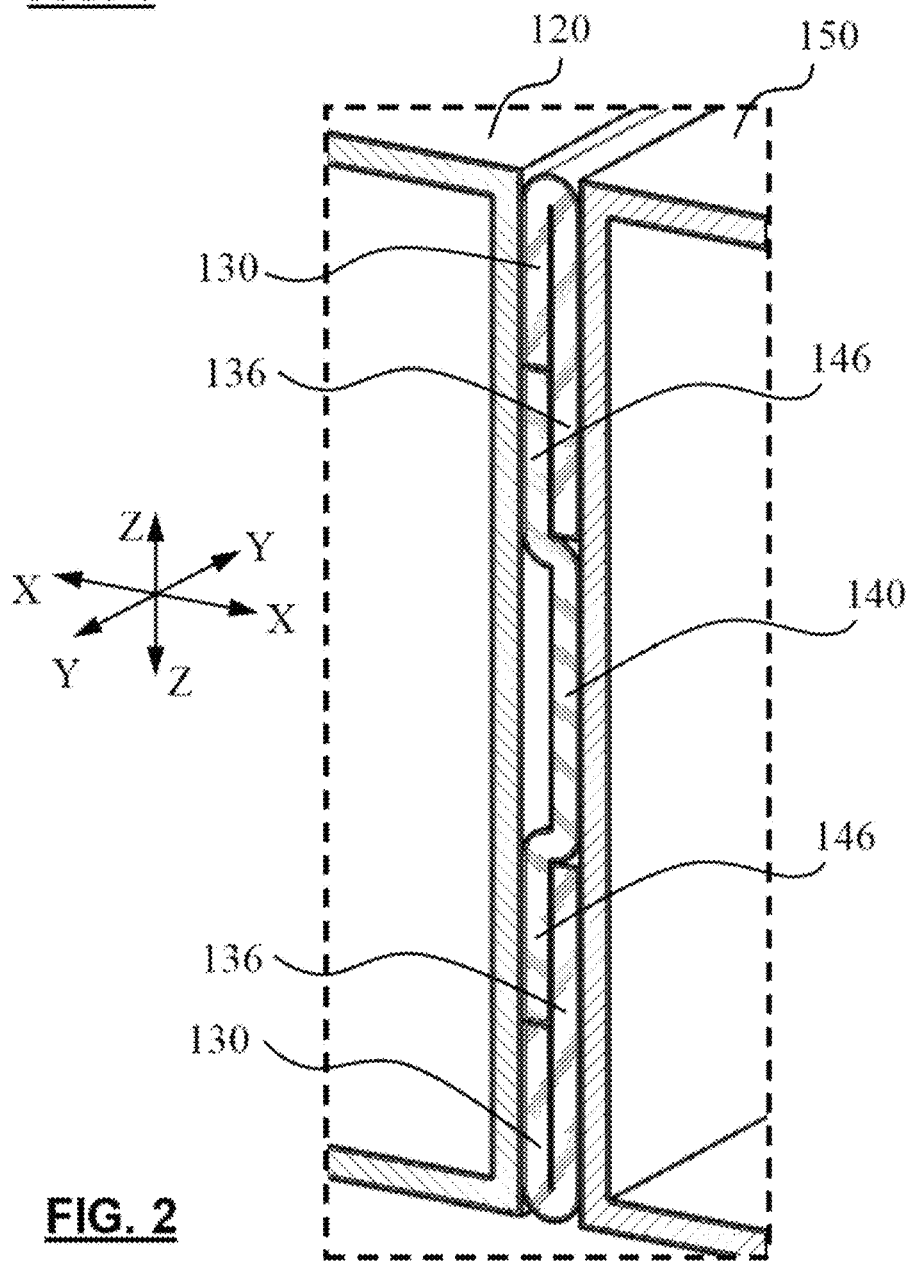
FIG. 2 is an enlarged partial view of portion 2 of FIG. 1.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

It will be readily understood that the components of the embodiments, as generally described and illustrated in the figures herein, may be arranged and designed in a wide variety of different configurations in addition to the described example embodiments. Thus, the following more detailed description of the example embodiments, as represented in conjunction with the figures, is not intended to limit the scope of the embodiments, as claimed, but is merely representative of example embodiments.

The description of elements in each figure may refer to elements of proceeding figures. Like numbers refer to like elements in all figures, including alternate embodiments of like elements.

As used herein, a list with a conjunction of "and/or" includes any single item in the list or a combination of items in the list. For example, a list of A, B and/or C includes only A, only B, only C, a combination of A and B, a combination of B and C, a combination of A and C or a combination of A, B and C. As used herein, a list using the terminology "one or more of" includes any single item in the list or a combination of items in the list. For example, one or more of A, B and C includes only A, only B, only C, a combination of A and B, a combination of B and C, a combination of A and C or a combination of A, B and C. As used herein, a list using the terminology "one of includes one and only one of" any single item in the list. For example, "one of A, B and C" includes only A, only B or only C and excludes combinations of A, B and C. As used herein, "a member selected from the group consisting of A, B, and C," includes one and only one of A, B, or C, and excludes combinations of A, B, and C." As used herein, "a member selected from the group consisting of A, B, and C and combinations thereof" includes only A, only B, only C, a combination of A and B, a combination of B and C, a combination of A and C or a combination of A, B and C.

In one aspect, FIGS. 1-5 show a server chassis 100 for mounting at least two computer servers to a server rack. The server chassis 100 includes a first housing 120 and a second housing 150 each configured to receive and enclose a computing device therein, e.g. a computer server, storage device, power supply and the like. The first housing 120 and the second housing 150 have the same physical dimensions and shapes e.g. in the embodiment as shown in the Figures, a hexahedron shape. The first housing 120 has a pair of first sidewalls 121 and 123 opposite to each other. Likewise, the second housing 150 has a pair of second sidewalls 154 and 156 opposite to each other. The first housing 120 and the second housing 150 are positioned with one of the first sidewalls, e.g. first sidewall 123 adjacent to and facing one of the second sidewalls, e.g. second sidewall 154. The other one of the first sidewalls, i.e. first sidewall 121 and the other one of the second sidewalls, i.e. second sidewall 156 are positioned away from each other, with the first sidewall 123 and the second sidewall 154 positioned between the first sidewall 121 and the second sidewall 156. For the purpose of directional and orientational reference of the parts and positional relationships in the context, an X-Y-Z coordinate system is defined and shown in the figures in which, the direction X-X is referred to as "width direction", the direction Y-Y is referred to as "depth direction", and the direction Z-Z is referred to as "height direction".

Server chassis 100 includes a pair of first brackets 110, 130 and a pair of second brackets 140, 160. The first brackets 110, 130 are mounted to the first sidewalls 121, 123 of the first housing 120 by e.g. screws 117, 137, respectively. The second brackets 140, 160 are mounted to the second sidewalls 154, 156 of the second housing 150 by e.g. screws 147, 167, respectively.

As shown in FIGS. 6-9, the first bracket 130 is in the form of a pair of straight retaining bars each having a main portion 134 and a first engagement portion 136 formed integral to the main portion 134. The pair of retaining bars are mounted to the first sidewall 123 of the first housing 120, spaced apart from each other along the height direction Z-Z, and arranged parallel to each other and parallel to a depth direction Y-Y, forming a space 135 between the pair of first engagement portion 136. The main portion 134 is mounted to the first sidewall 123 of the first housing 120, and with the first engagement portion 136 positioned spaced apart from the first sidewall 123 of the first housing 120, forming a first groove 132 between the first engagement portion 136 and the first sidewall 120.

The second bracket 140 is in the form of a single piece of plate having a middle portion 144 and a pair of second engagement portions 146 formed integral to and at each one side of the middle portion 144. The second engagement portions 146 are positioned offset with respect to the middle position 144 such that upon the second bracket 140 being mounted to the second housing 150 and oriented parallel to the depth direction Y-Y, the middle portion 144 is in contact with the second sidewall 154 of the second housing 150. The second engagement portions 146 are positioned spaced apart from, and form a pair of second grooves 142 with respect to, the second sidewall 154 of the second housing 150.

The first bracket 130 and the second bracket 140 are so configured such that the second groove 142 is the same as or slightly greater than the thickness of the first engagement portion 136, and the first groove 132 is the same as or slightly greater than the thickness of the second engagement portion 146. The first housing 120, the second housing 150, the first bracket 130 and the second bracket 140 are made of rigid material such as steel, aluminum alloy or the like, with the strength and rigidity suitable for supporting computer servers and components to a server rack. Other rigid materials may also be used.

As shown in FIGS. 10-13, to assemble the first housing 120 and the second housing 150 to each other, the first housing 120 and the second housing 150 are placed with the first sidewall 123 and the second sidewall 154 adjacent to and facing each other. The second engagement portions 146 are brought into alignment with the first grooves 132 and meanwhile, the first engagement portions 136 are brought into alignment with the second grooves 142. The first housing 120 is then slid along an assembling direction 120a, which is parallel to the depth direction Y-Y, with respect to the second housing 150 during which, the second engagement portion 146 slid along and are inserted into the first grooves 132, and the first engagement portion 136 slid along and are inserted into the second grooves 142.

As shown in FIGS. 14-17, the server chassis 100 may further include a stopper in the form of e.g. a flange plate 148, which is connected to the second housing 150 and positioned at the end of the second bracket 140, such that upon the first housing 120 and the second housing 150 being positioned flush at the first and second end walls 1208, 1508 with respect to each other, the first housing 120 is brought into abutment against the flange plate 148 such that further sliding movement of the first housing 120 relative to the second housing 150 along the assembling direction 120a is prevented. The first housing 120 and the second housing 150 may be secured to the flushed position by e.g. screws 149 fastening the flange plate 148 to the first housing 120.

Assembled in the above-illustrated manner, the second engagement portions 146 are fit into the first grooves 132 and meanwhile, the first engagement portions 136 are fit into the second grooves 142 the first housing 120, by which, the first housing 120 and the second housing 150 are jointed to each other, forming an integral structure. The engagement of the second engagement portions 146 with the first grooves 132, and the engagement of the first engagement portions 136 with the second grooves 142 allows the first housing 120 to slide relative to the second housing 150 along the depth direction Y-Y. In the meantime, the first housing 120 and the second housing 150 are prevented from separating apart from each other along the width direction X-X, the height direction Z-Z and any other angled direction A intersecting the depth direction Y-Y. Rotational movement of the second housing 150 relative to the first housing 120 is also prevented.

The sever chassis 100 is capable of supporting and mounting two computer servers (or other equipment) to a server rack, with one of the servers housed/fitted to the first housing 120 and the other one housed/fitted into the second housing 150, and with the first sidewall 121 and the second sidewall 156 secured to the rails 16 of the server rack 10.

As illustrated in FIGS. 18-21, upon being mounted to a server rack 10, the server chassis 100 is supported by the rack rails 16 at a first support point 120s at the first sidewall 121 and a second support point 150s at the second sidewall 156. The total load of the server chassis 100, depicted in FIG. 20 by a weight 120w of the first housing 120 and a computer server fitted therein, and a weight 150w of the second housing 150 and the computer server fitted therein, is borne by the first support 120s and the second support 150s along the height direction Z-Z. The bending moment 120m and 150m generated by the respective weight 120w and 150w, result in a compressive force 1201F/1501F and a tensile force 1203F/1503F exerting on the first housing 120 and the second housing 150. The compressive force 1201F/1501F act against each other at a position above the center axis 102 of the first housing 120 and the second housing 150. The tensile force 1203F/1503F act in a direction away from each other, at a position below the center axis 102.

With the second engagement portion 146 fitted in the first grooves 132 and the first engagement portion 136 fitted in the second grooves 142, the compressive force 1201F/1501F are borne by the upper second engagement portion 146a abutting against the first sidewall 123 of the first housing 120, and by the upper first engagement portion 136a abutting against the second sidewall 154 of the second housing 150. In the meantime, the tensile force 1203F and 1503F are borne by the lower second engagement portion 146b abutting against the lower first engagement portion 136b. As such, the first housing 120 and the second housing 150 are well fitted and secured to each other for supporting and mounting two computer servers to the server rack 10. Note that other equipment may also be fitted into the first housing 120 and/or second housing 150.

Figure 3:
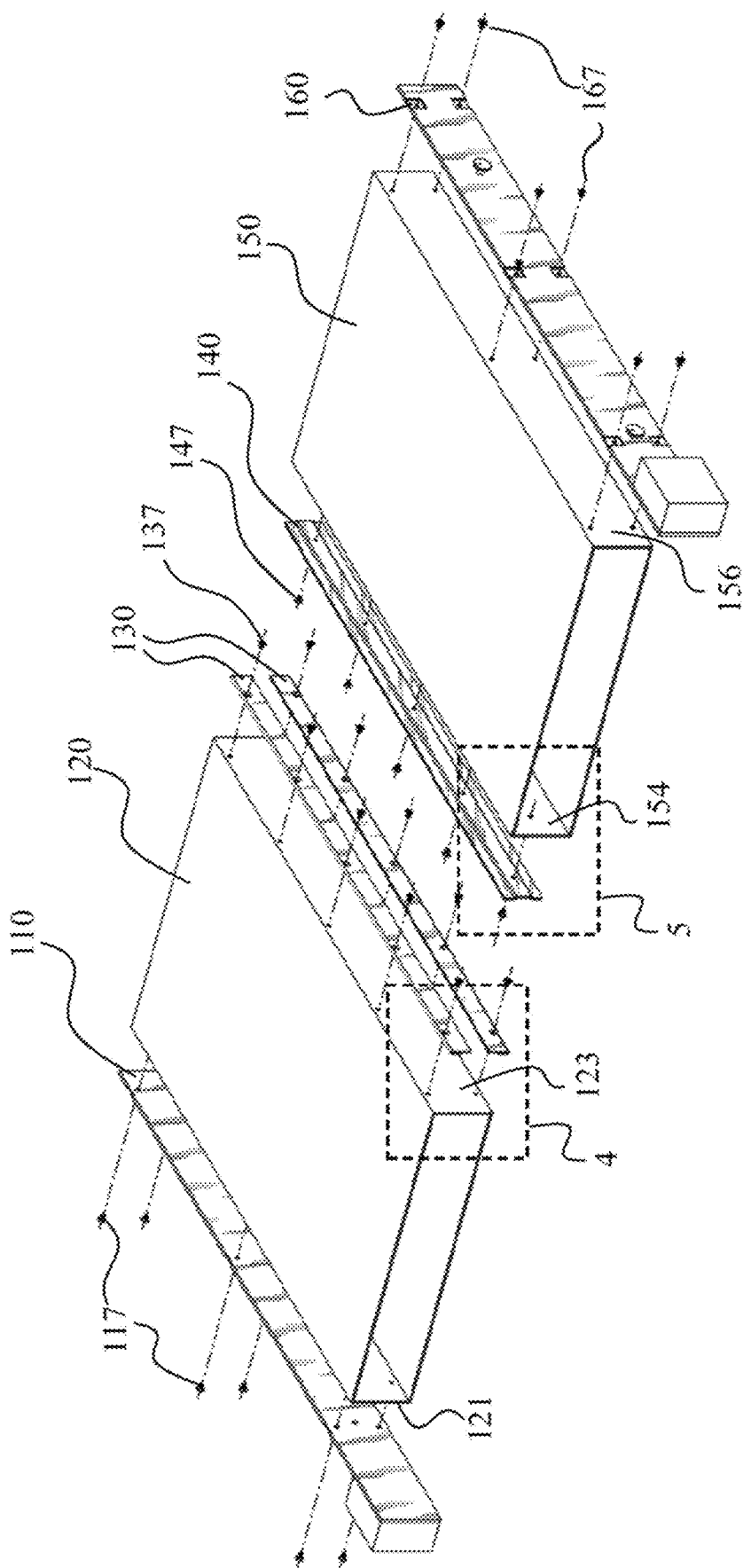
FIG. 3 is an exploded perspective view of FIG. 1.
Figure 4:
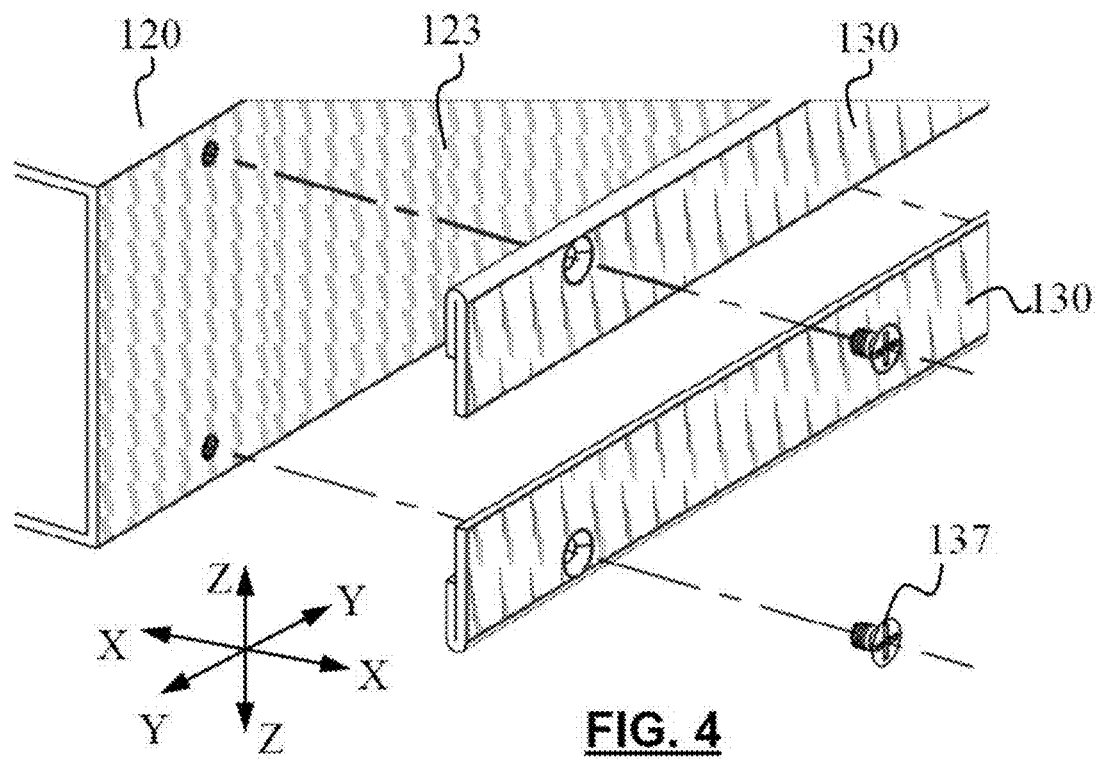
FIG. 4 an enlarged partial view of portion 4 of FIG. 3.
Figure 5:
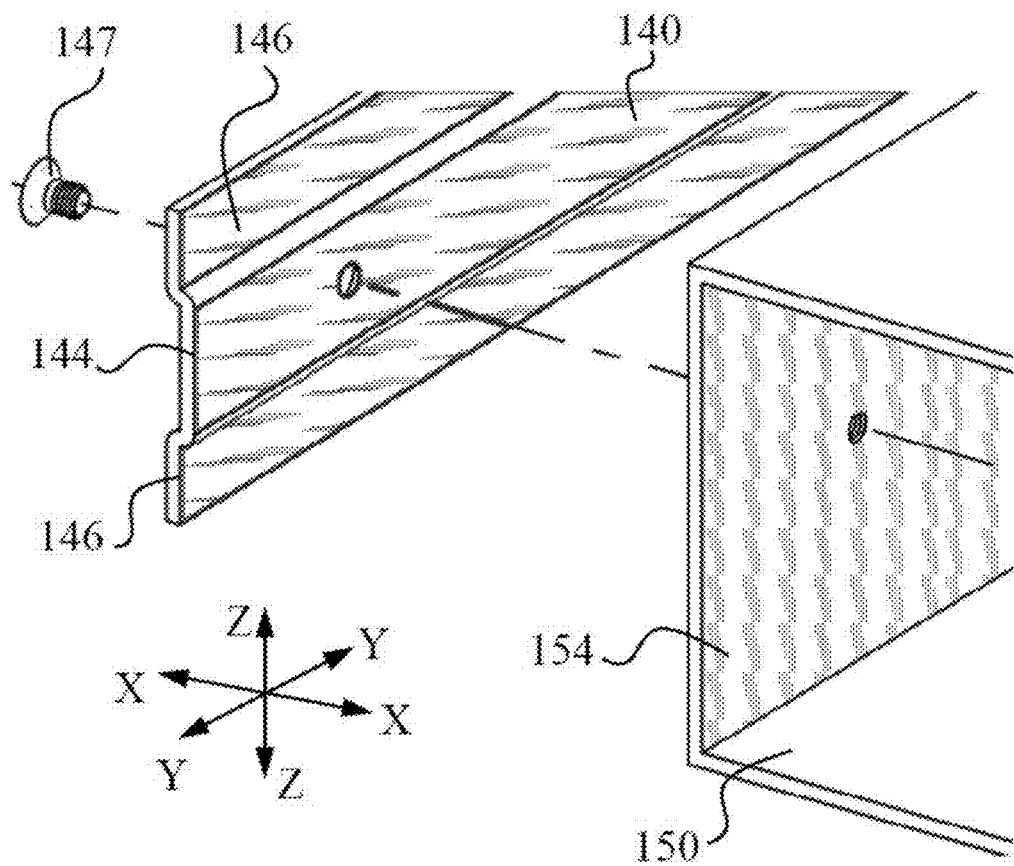
FIG. 5 is an enlarged partial view of portion 5 of FIG. 3.
Figure 6:
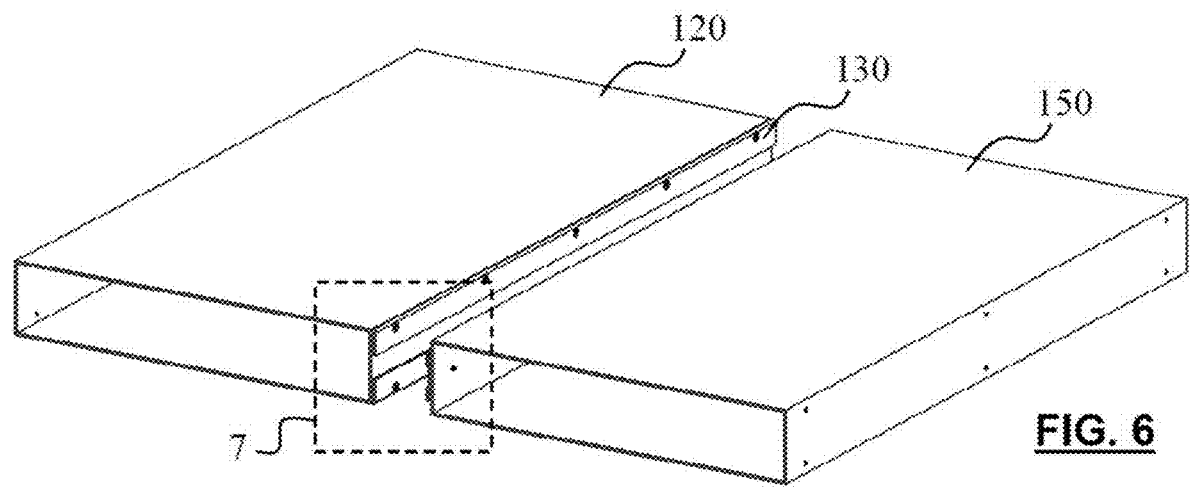
FIG. 6 is a perspective view showing the server chassis of FIG. 1 before assembly.
Figure 7:
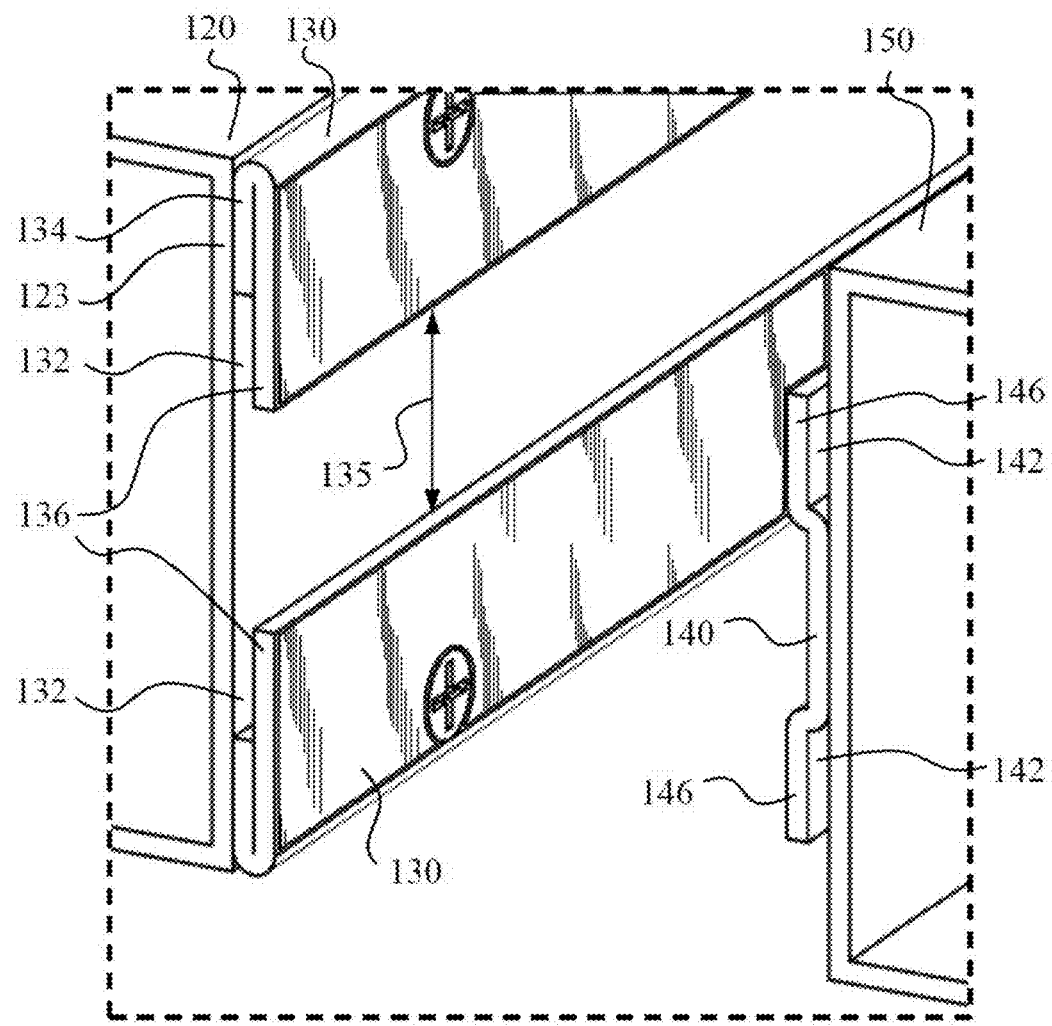
FIG. 7 is an enlarged partial view of portion 7 of FIG. 6.
Figure 8:
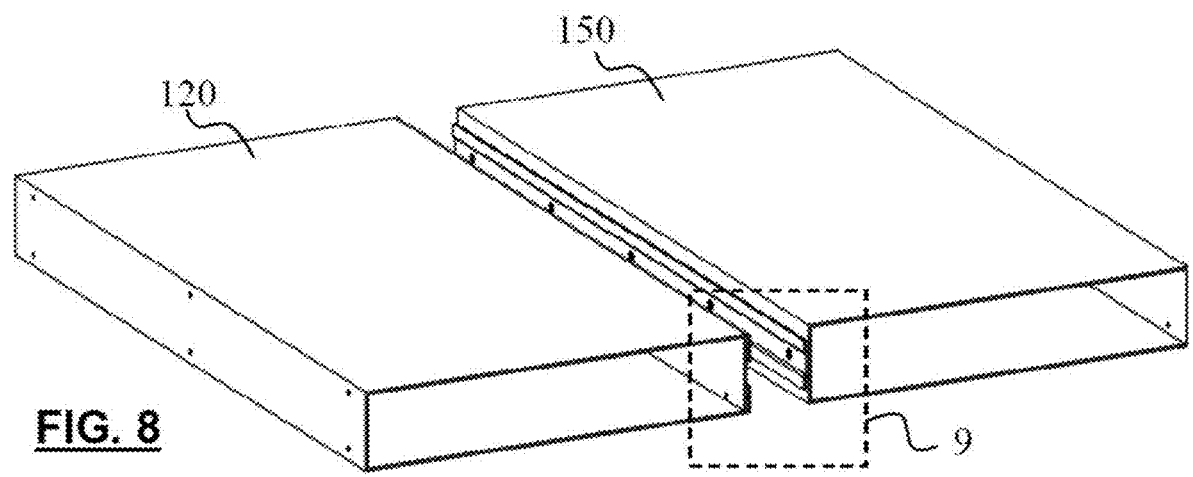
FIG. 8 is another perspective view showing the server chassis of FIG. 1 before assembly.
Figure 9:
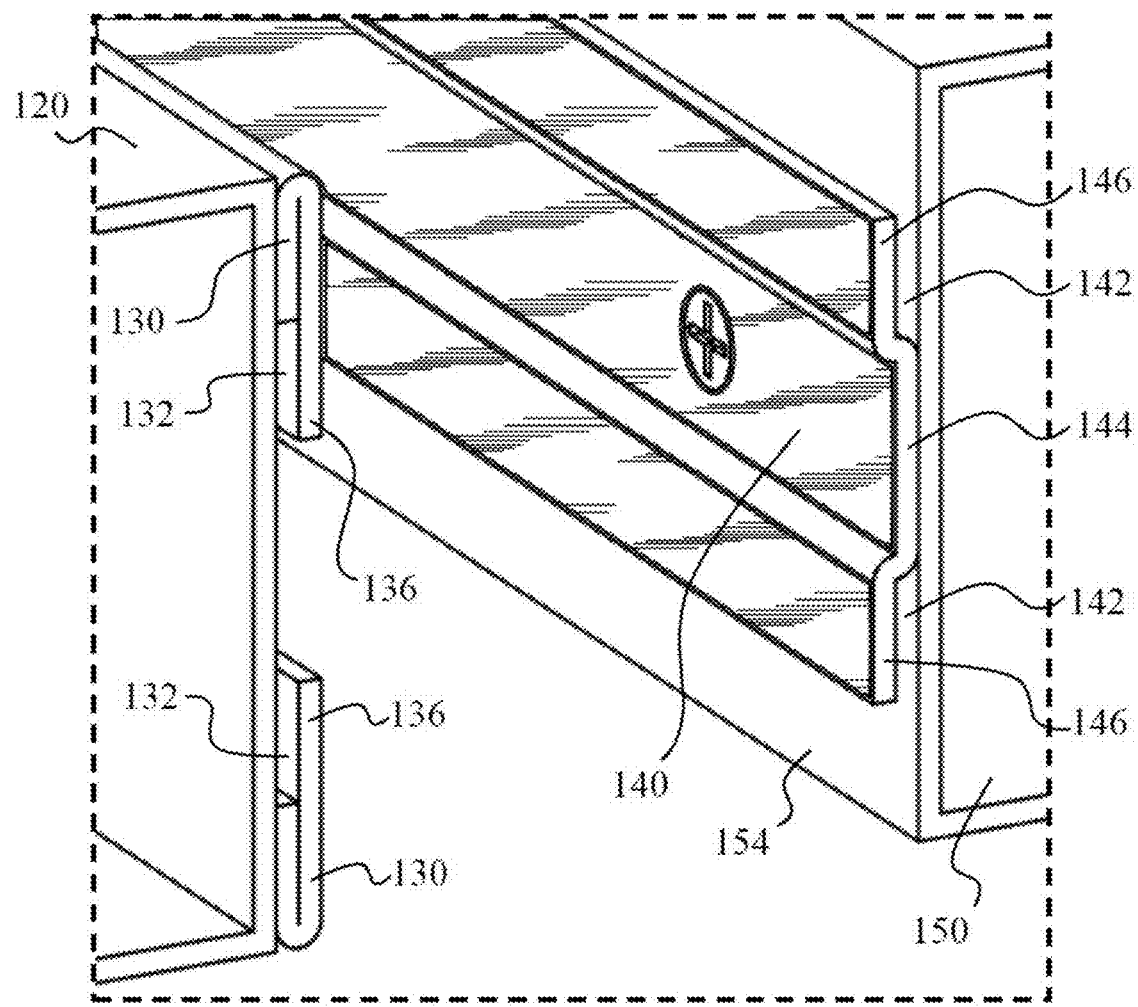
FIG. 9 is an enlarged partial view of portion 9 of FIG. 8.
Figure 10:
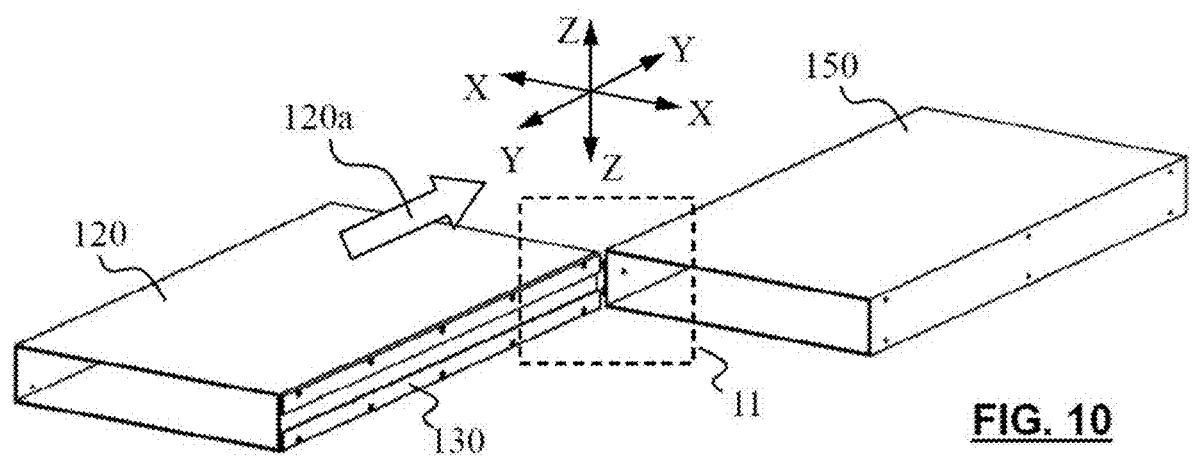
FIG. 10 is a perspective view showing the server chassis of FIG. 1 in which the two housings are to be assembled.
Figure 11:
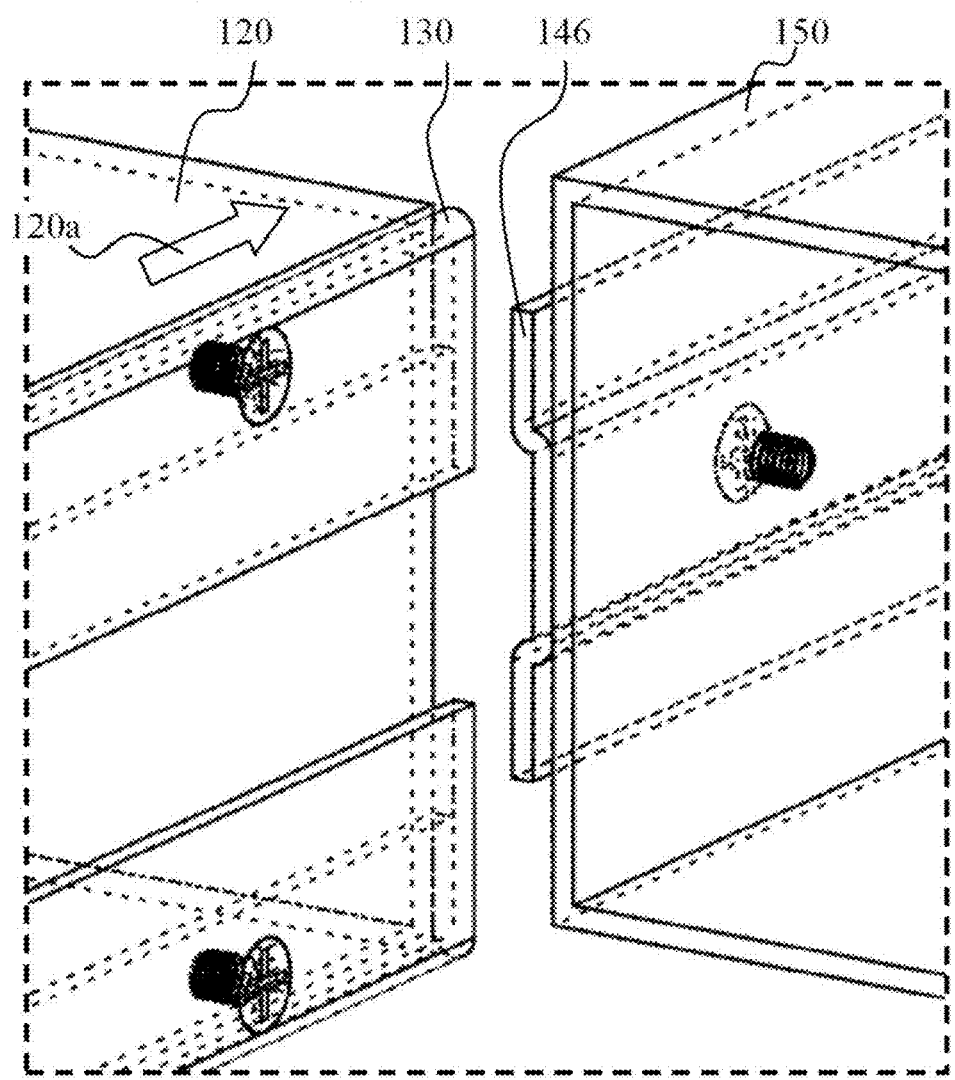
FIG. 11 is an enlarged partial view of portion 11 of FIG. 10.
Figure 12:
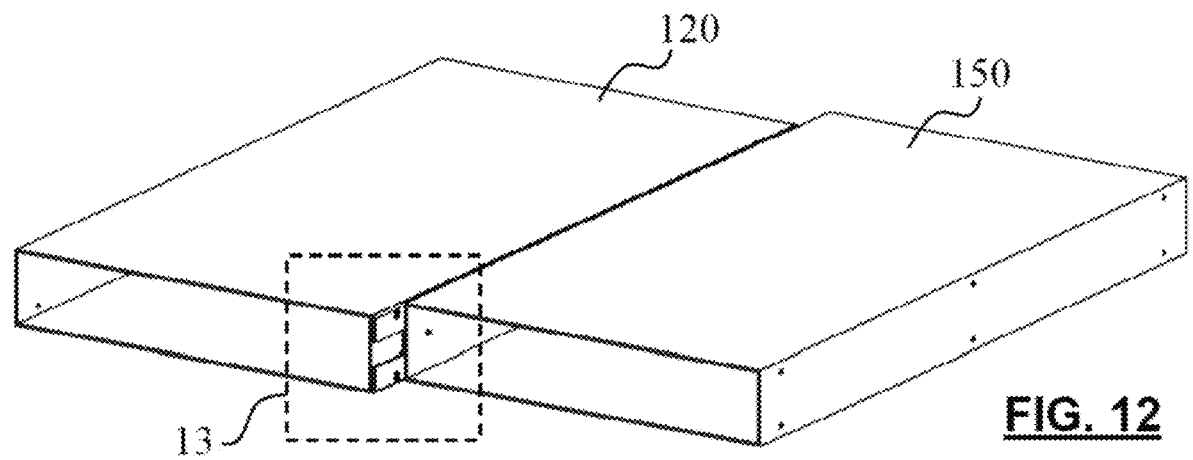
FIG. 12 is a perspective front view showing the server chassis of FIG. 1 in which the two housings are in the process of being assembled.
Figure 13:
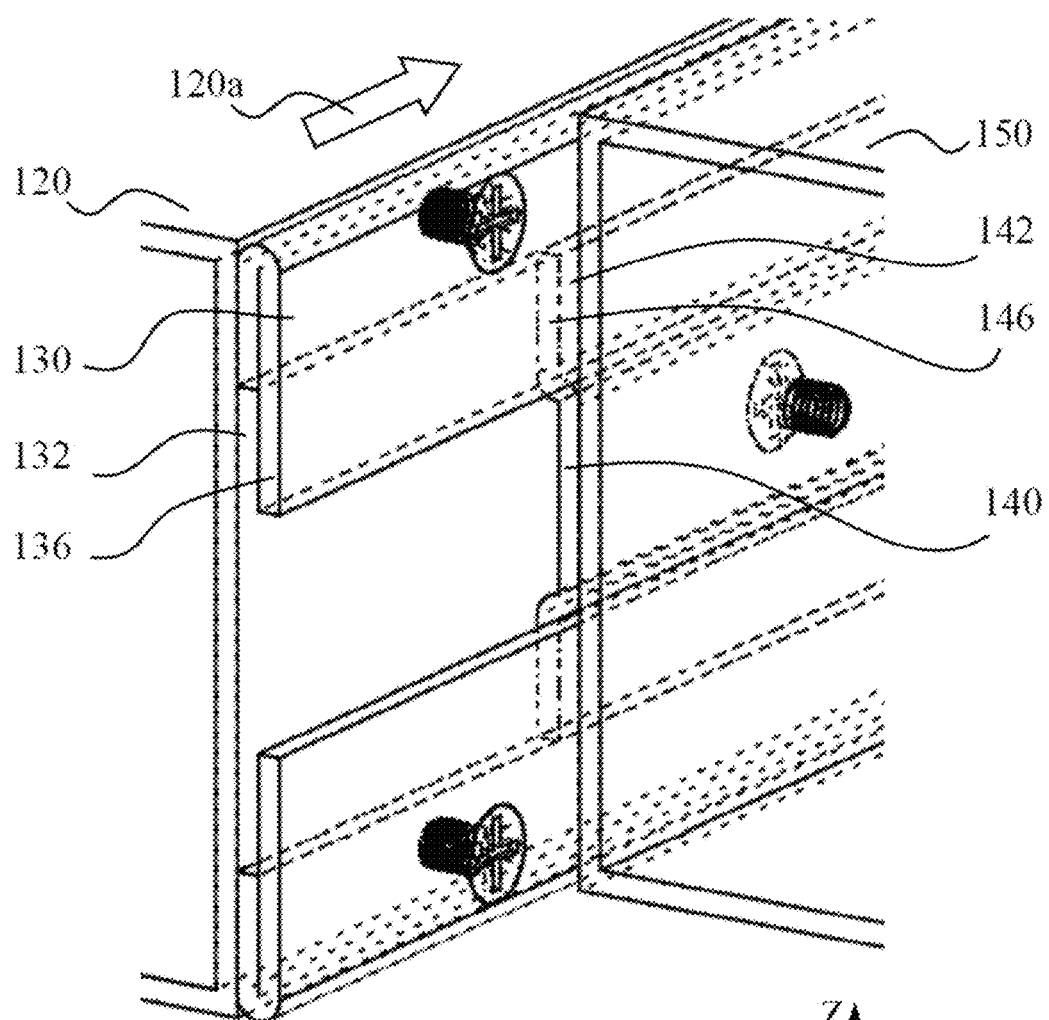
FIG. 13 is an enlarged partial view of portion 13 of FIG. 12.
Figure 14:
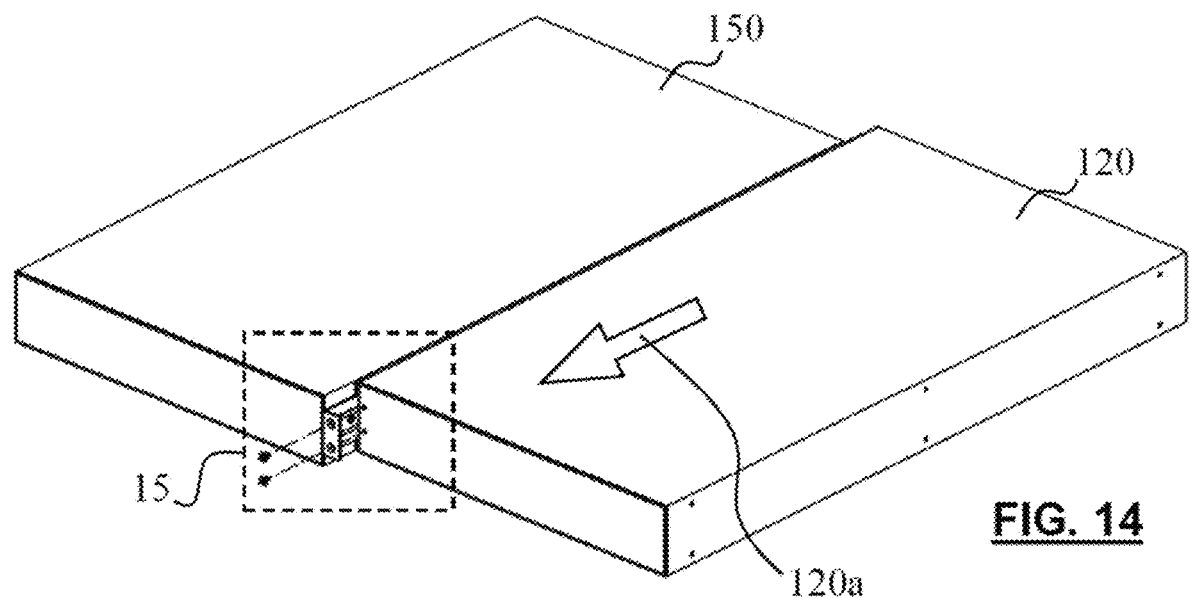
FIG. 14 is a perspective back view of FIG. 12.
Figure 15:
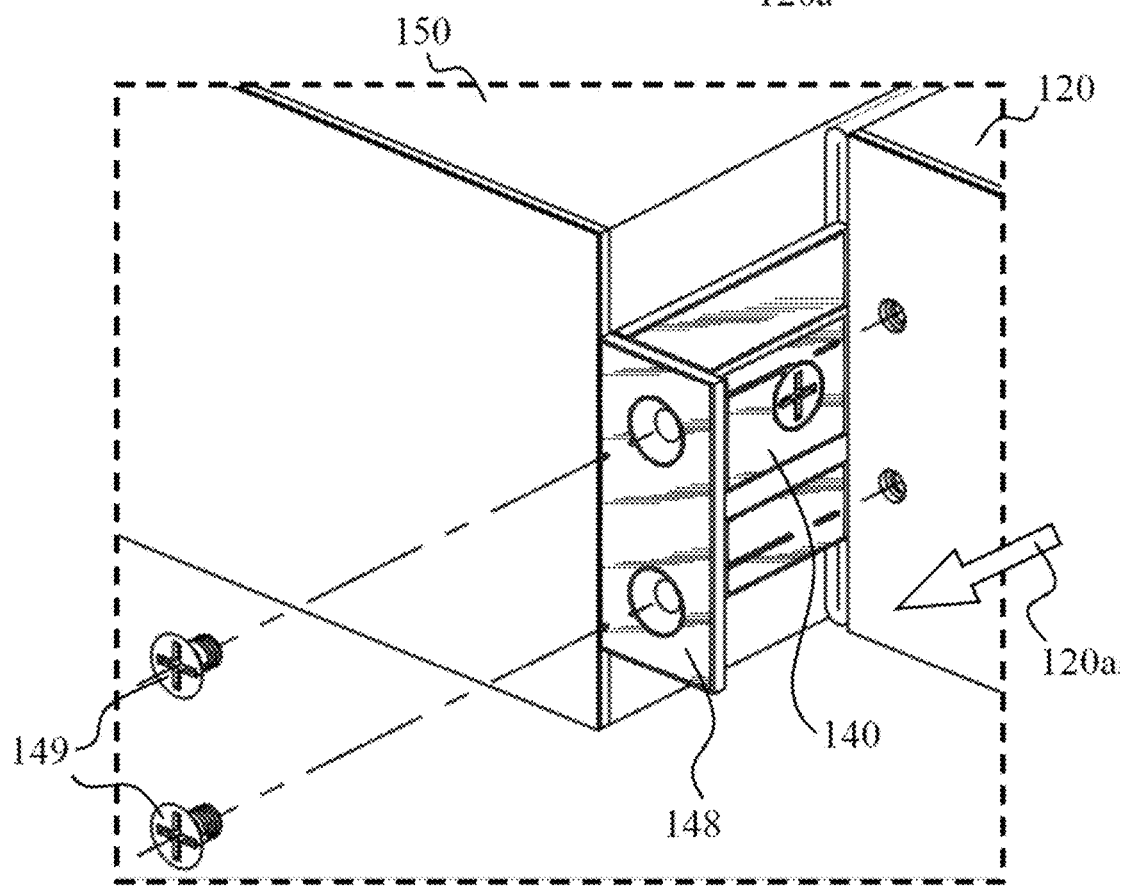
FIG. 15 is an enlarged partial view of portion 15 of FIG. 14.
Figure 16:
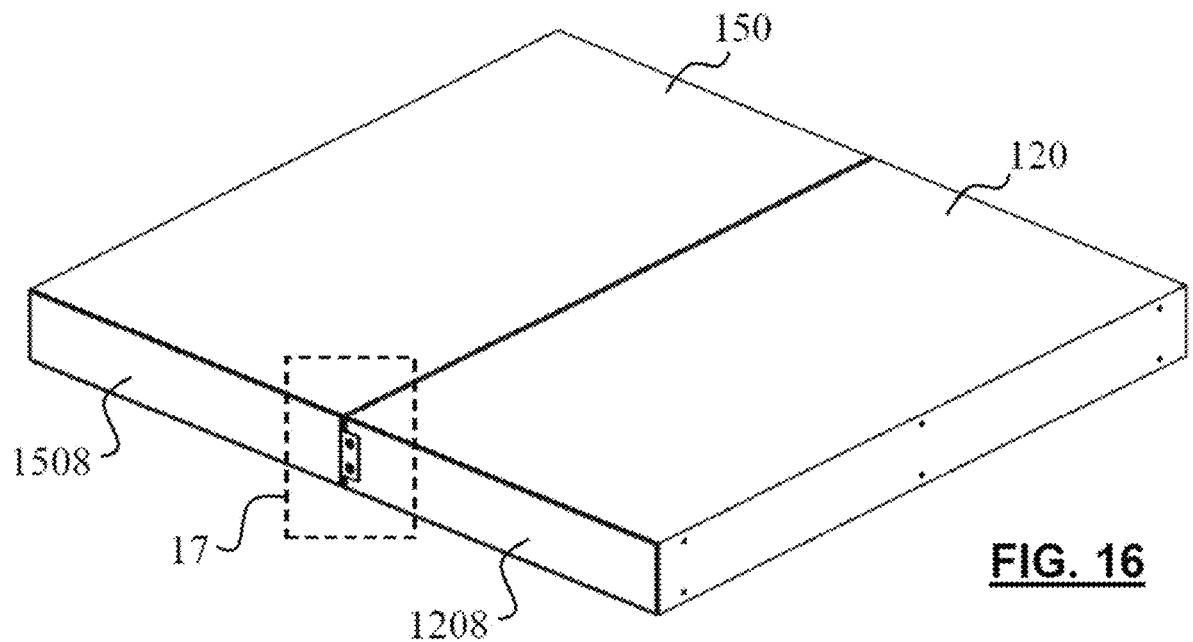
FIG. 16 is a perspective view of FIG. 14 in which the two housings are in an assembled position.
Figure 17:
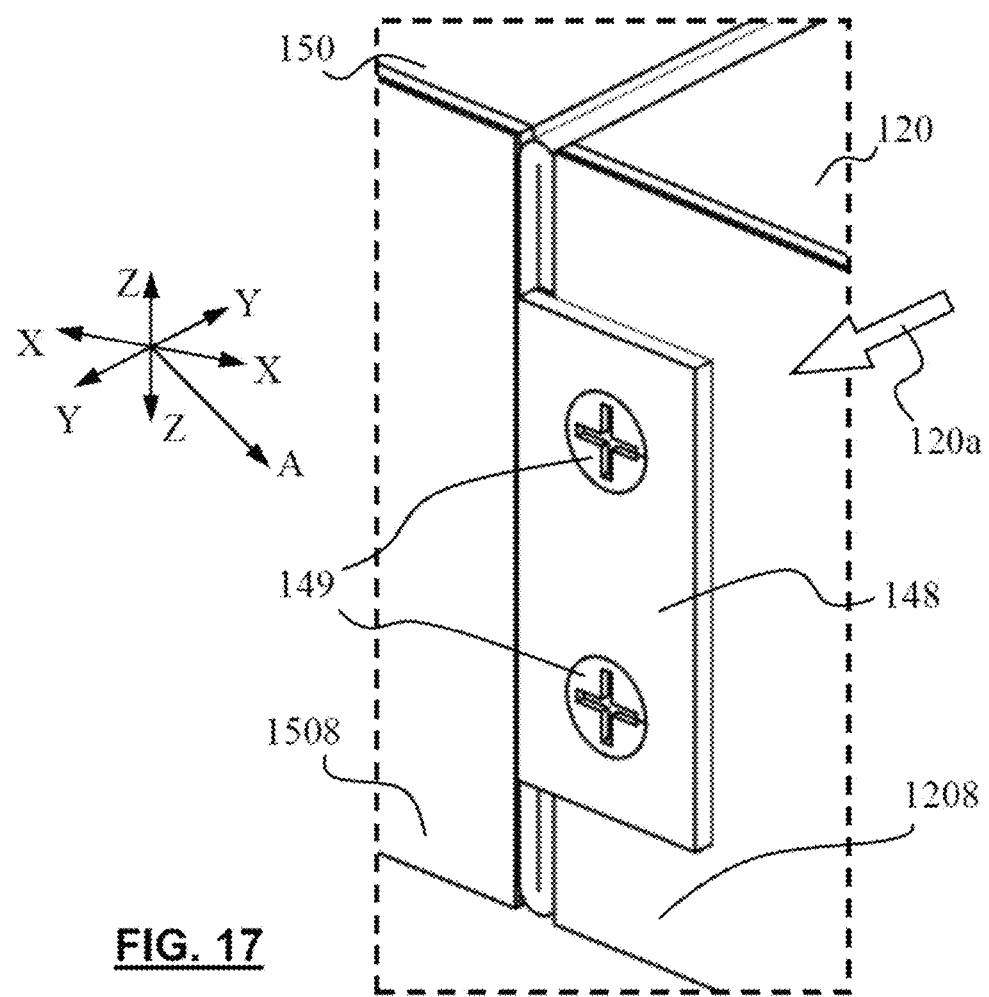
FIG. 17 is an enlarged partial view of portion 17 of FIG. 16.
Figure 18:
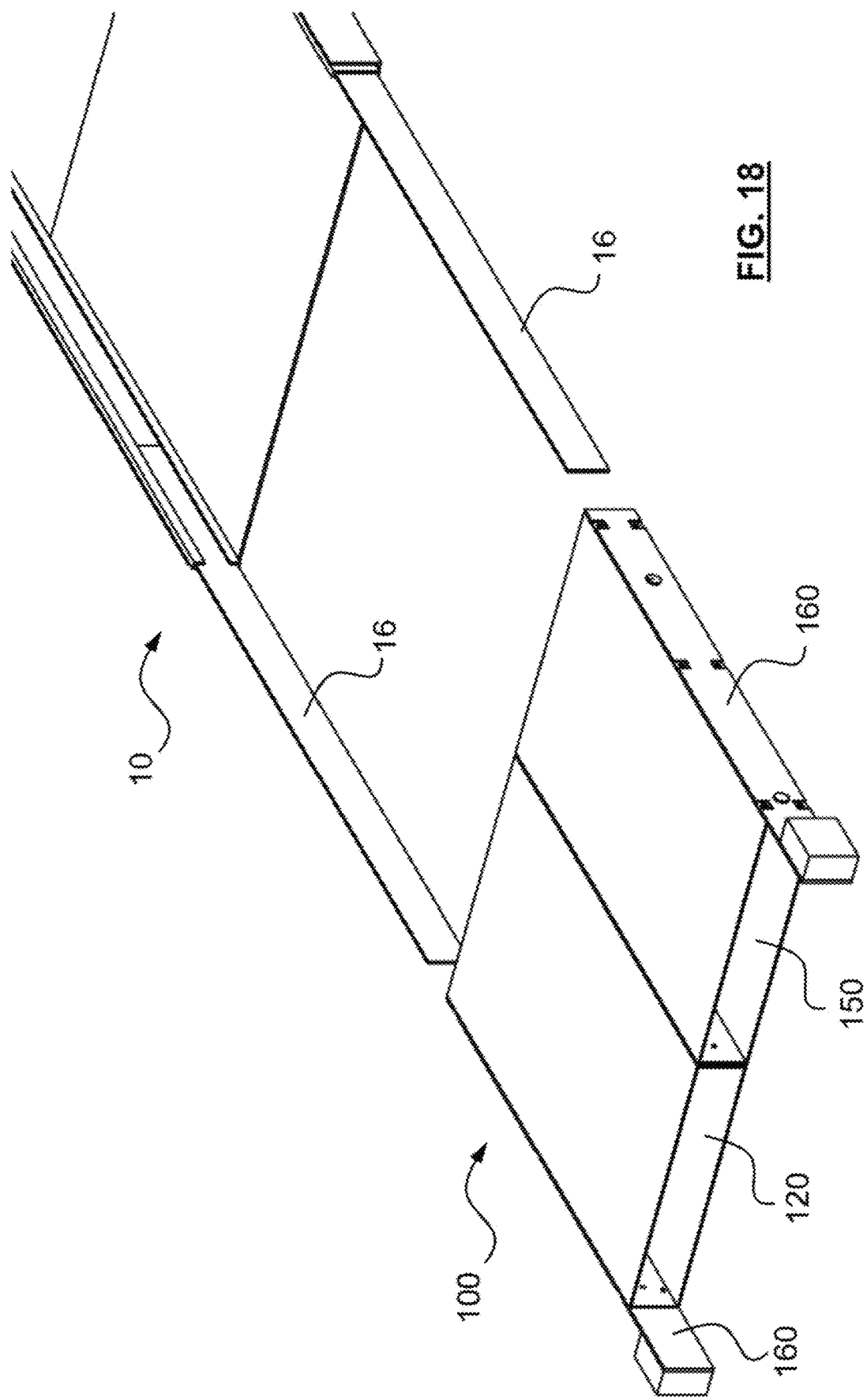
FIG. 18 is a perspective view showing the server chassis of FIG. 1 to be mounted to a server rack.
Figure 19:
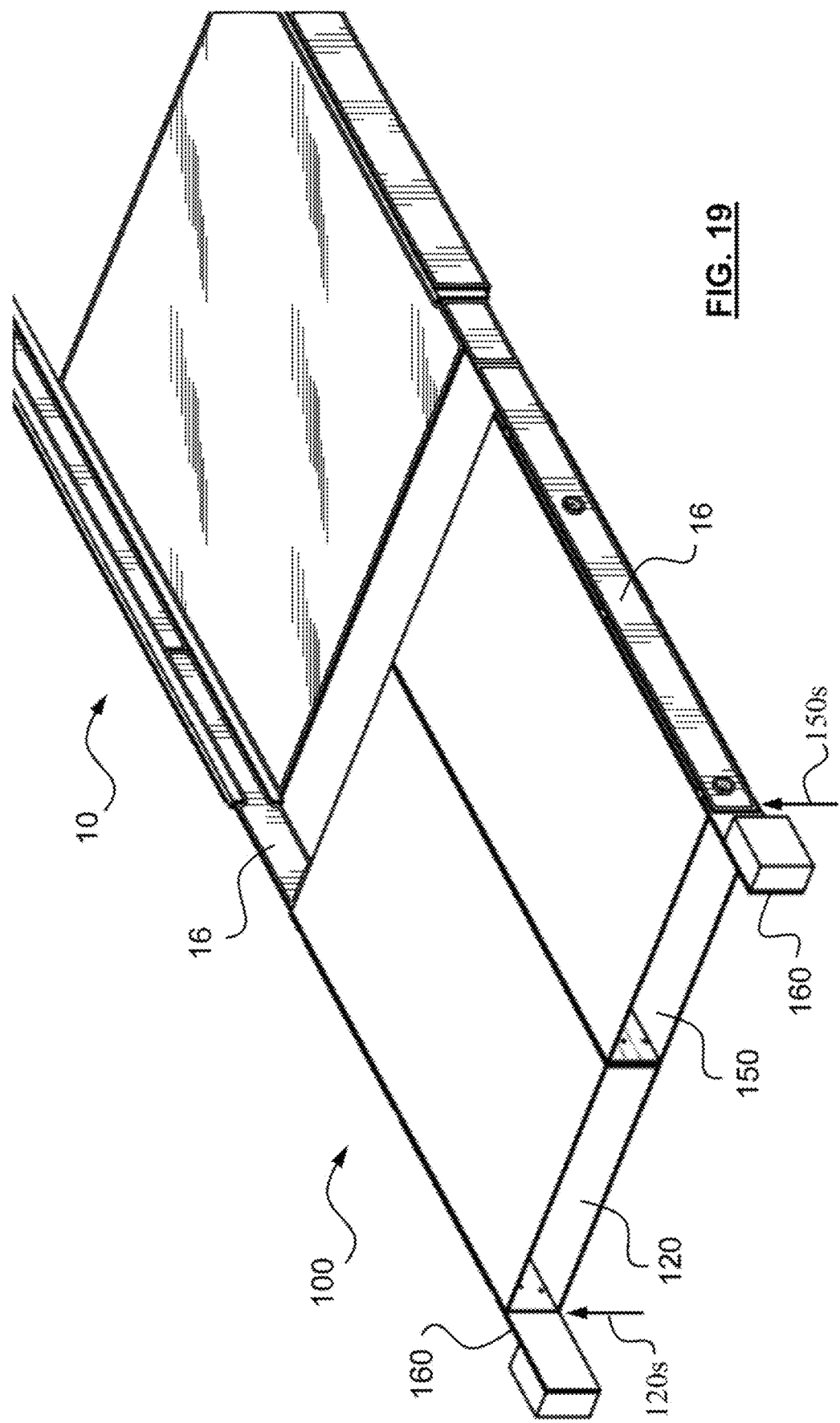
FIG. 19 is a perspective view showing the server chassis of FIG. 1 being mounted to a server rack.
Figure 20:
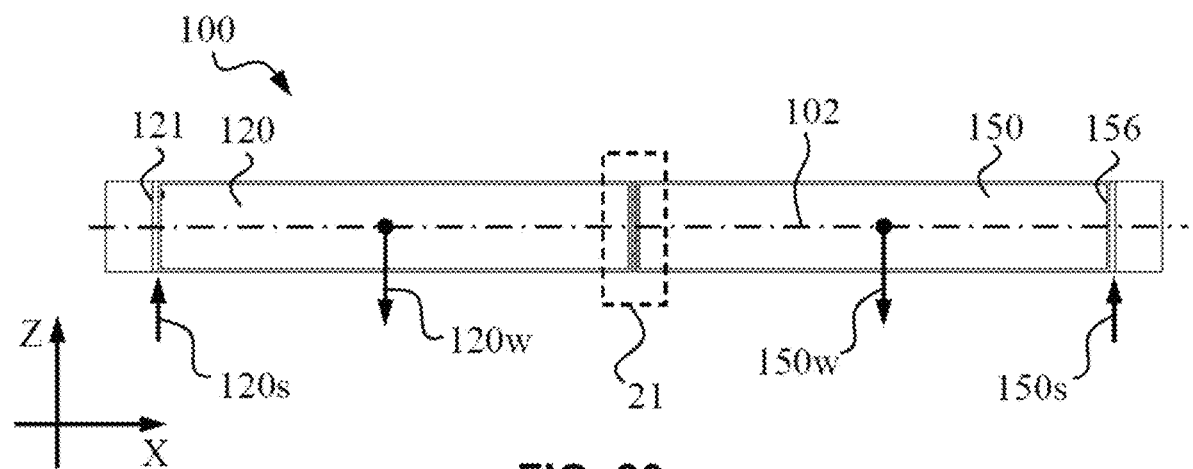
FIG. 20 is a front view of FIG. 1.
Figure 21:
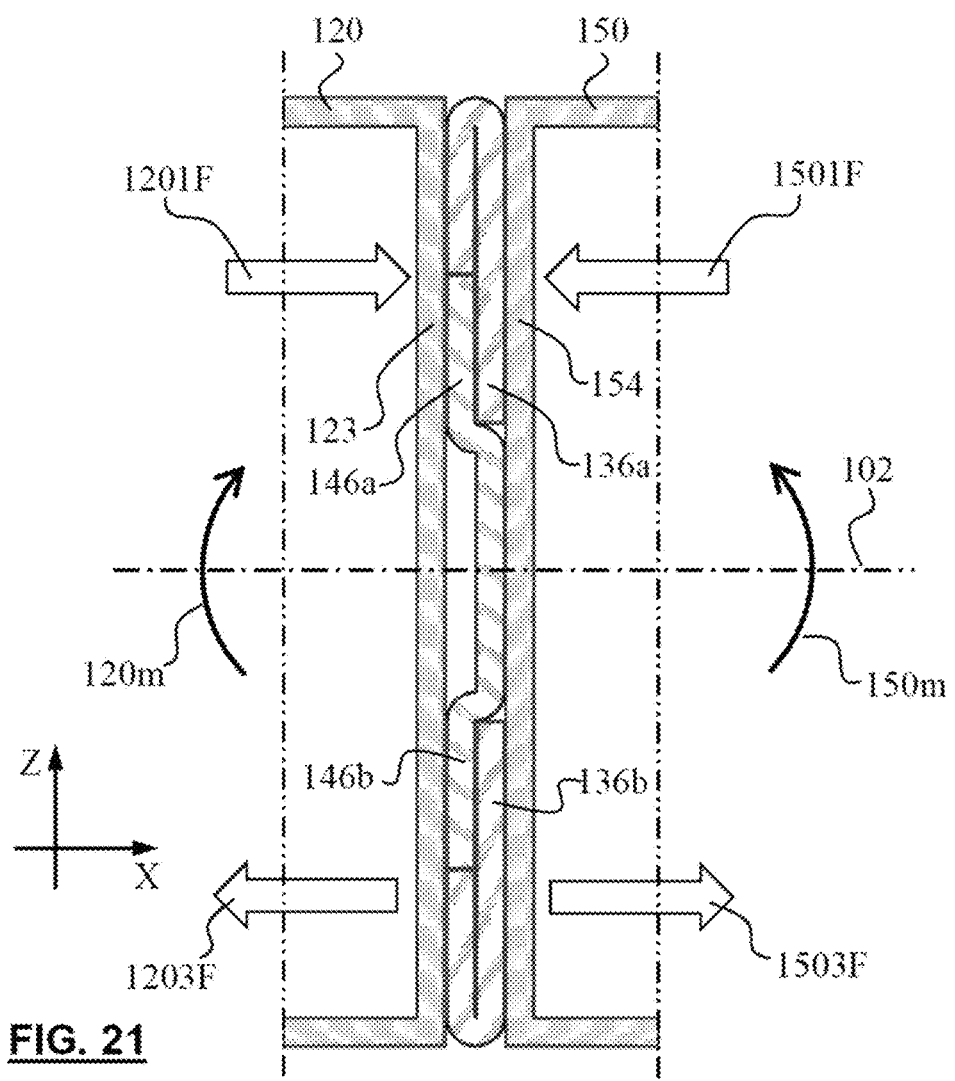
FIG. 21 is an enlarged partial view of portion 21 of FIG. 20.

As shown in FIGS. 3, 18 and 19, the server chassis 100 may further include a first mounting bracket 110 fixed to the first sidewall 121 of the first housing 120, and a second mounting bracket 160 fixed to the second sidewall 156 of the second housing. The first mounting bracket 110 and the second mounting bracket 160 assist in the mounting operation of the server chassis 100 to a server rack 10.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be effected therein by one skilled in the art without departing from the scope or spirit of the disclosure.

What is claimed is:

1. A server chassis configured to mount to a server rack, the server chassis comprising:
   a first housing comprising a first sidewall, the first housing configured to mount to the server rack and house a first electronic component; and
   a second housing comprising a second sidewall, the second housing configured to mount to the server rack and house a second electronic component,
   wherein:
   the first housing comprises a first bracket mounted to the first sidewall of the first housing,
   the second housing comprises a second bracket mounted to the second sidewall of the second housing,
   the first bracket comprises a plurality of retaining bars spaced apart from each other in a height direction of the first sidewall, each said retaining bar including a main portion and a first engagement portion in which a first groove is created between each said first engagement portion and the first sidewall upon mounting each said retaining bar to the first sidewall, and the first engagement portions of the plurality of retaining bars are spaced apart from each other in the height direction of the first sidewall,
   the second bracket comprises a main portion and a plurality of second engagement portions spaced apart from each other in a height direction of the second sidewall and on opposing sides of the main portion, the plurality of second engagement portions creating a second groove between each said second engagement portion and the second sidewall upon mounting the main portion of the second bracket to the second sidewall, and
   the second bracket of the second housing is engagable to the first bracket of the first housing via engaging said first engagement portions and said second grooves and via engaging said second engagement portions and said first grooves to secure the first housing and the second housing to each other.

2. The server chassis of claim 1, wherein the second bracket is slidably engageable to the first bracket.

3. The server chassis of claim 2, wherein the second bracket is slidable relative to the first bracket along a first direction parallel to a depth direction of the server chassis to disengage the first housing and the second housing from each other, to prevent a relative rotational movement of the first housing and the second housing about an axis parallel to the depth direction, and to prevent movement of the first housing and the second housing along a second direction intersecting the depth direction.

4. The server chassis of claim 1, wherein the pair of first engagement portions are brought into abutment with the second sidewall of the second housing.

5. The server chassis of claim 1, wherein the second engagement portions are brought into abutment with the first sidewall of the first housing.

6. The server chassis of claim 1 further comprising a stopper mounted to a back end portion of the second bracket, wherein the first housing is brought into abutment with the stopper upon a first end wall of the first housing positioned flush with respect to a second end wall of the second housing.

7. The server chassis of claim 6, further comprising a fastening member to secure the stopper to the first housing.

8. The server chassis of claim 1, wherein the first housing and the second housing are secured to each other upon which the first sidewall of the first housing is positioned parallel to and faces the second sidewall of the second housing.

9. The server chassis of claim 1, further comprising a first mounting bracket fixed to the first housing and a second mounting bracket fixed to the second housing, wherein the first mounting bracket and the second mounting bracket are configured to mount the server chassis to a server rack.

10. The server chassis of claim 1, wherein each of the first retaining bars of the retaining bars comprises a sheet of rigid material bent back on itself to form the first groove, and wherein the second retaining bar comprises a sheet of rigid material with a bend at each edge of the main portion to form each of the plurality of second grooves.

11. A server chassis configured to mount to a server rack, the server chassis comprising:
   a first housing comprising a first sidewall, the first housing configured to mount to the server rack and house a first server; and
   a second housing comprising a second sidewall, the second housing configured to mount to the server rack and house a second server,
   wherein:
      the first housing comprises a first bracket mounted to the first sidewall of the first housing,
      the second housing comprises a second bracket mounted to the second sidewall of the second housing,
      the first bracket comprises a pair of retaining bars spaced apart from each other in a height direction of the first sidewall, each said retaining bar separately attachable to the first sidewall of the first housing, each said retaining bar comprising a first main portion and a first engagement portion in which a first groove is created between each said first engagement portion and the first sidewall upon mounting each said retaining bar to the first sidewall via the first main portion of the retaining bar, the first engagement portions of the pair of retaining bars are spaced apart from each other in the height direction of the first sidewall,
      the second bracket comprises a second main portion and a pair of second engagement portions spaced apart from each other by the second main portion in the height direction and on opposing sides of the second main portion, each of the second engagement portions creating a second groove between each said second engagement portion and the second sidewall upon mounting the second main portion to the second sidewall, and
      the second bracket of the second housing is engagable to the first bracket of the first housing via engaging said first engagement portions and said second grooves and via engaging said second engagement portions and said first grooves to secure the first housing and the second housing to each other,
      the second bracket is slidably engageable to the first bracket, and
      the second bracket is slidable relative to the first bracket along a first direction parallel to a depth direction of the server chassis to disengage the first housing and the second housing from each other, to prevent a relative rotational movement of the first housing and the second housing about an axis parallel to the depth direction, and to prevent movement of the first housing and the second housing along a second direction intersecting the depth direction.

12. The server chassis of claim 11, wherein the pair of retaining bars are positioned to face each other along the height direction, and the second bracket is positioned between the pair of retaining bars.

13. The server chassis of claim 11, further comprising a stopper mounted to a back end portion of the second bracket, wherein the first housing is brought into abutment with the stopper upon a first end wall of the first housing positioned flush with respect to a second end wall of the second housing.

14. The server chassis of claim 12, further comprising a fastening member to secure a stopper to the first housing.

15. The server chassis of claim 11, wherein the first housing and the second housing are secured to each other upon which the first sidewall of the first housing is positioned parallel to and face the second sidewall of the second housing.

16. The server chassis of claim 11, further comprising a first mounting bracket fixed to the first housing and a second mounting bracket fixed to the second housing, wherein the first mounting bracket and the second mounting bracket are configured to mount the server chassis to a server rack.

17. The server chassis of claim 11, wherein each of the first retaining bars of the pair of retaining bars comprises a sheet of rigid material bent back on itself to form the first groove, and wherein the second retaining bar comprises a sheet of rigid material with a bend at each edge of the main portion to form each of the plurality of second grooves.

18. A server chassis configured to mount to a server rack, the server chassis comprising:
   a first housing comprising a first sidewall, the first housing configured to mount to the server rack and house a first server;
   a second housing comprising a second sidewall, the second housing configured to mount to the server rack and house a second server; and
   a stopper mounted to a back end portion of the second bracket, wherein the first housing is brought into abutment with the stopper upon a first end wall of the first housing positioned flush with respect to a second end wall of the second housing, and a fastening member to secure the stopper to the first housing,
   wherein the first housing comprises a first bracket mounted to the first sidewall of the first housing, and the second housing comprises a second bracket mounted to the second sidewall of the second housing, the second bracket of the second housing engagable to the first bracket of the first housing to secure the first housing and the second housing to each other,
   wherein the second bracket is slidably engageable to the first bracket and the second bracket is slidable relative to the first bracket along a first direction parallel to a depth direction of the server chassis to disengage the first housing and the second housing from each other, to prevent a relative rotational movement of the first housing and the second housing about an axis parallel to the depth direction, and to prevent movement of the first housing and the second housing along a second direction intersecting the depth direction,
   wherein:
      the first bracket comprises a pair of retaining bars spaced apart from each other in a height direction of the first sidewall, each said retaining bar separately attachable to the first sidewall of the first housing, each said retaining bar comprising a first main portion and a first engagement portion in which a first groove is created between each said first engagement portion and the first sidewall upon mounting each said retaining bar to the first sidewall via the first main portion of the retaining bar, the first engagement portions of the pair of retaining bars are spaced apart from each other in the height direction of the first sidewall, the pair of retaining bars are positioned to face each other along the height direction, the second bracket is positioned between the pair of retaining bars and comprises a second main portion and a pair of second engagement portions spaced apart from each other by the second main portion in the height direction and on opposing sides of the second main portion, each of the second engagement portions creating a second groove between each said second engagement portion and the second sidewall upon mounting the second main portion to the second sidewall, and the second bracket of the second housing is engagable to the first bracket of the first housing via engaging said first engagement portions and said second grooves and via engaging said second engagement portions and said first grooves to secure the first housing and the second housing to each other.

19. The server chassis of claim 18, further comprising a first mounting bracket fixed to the first housing and a second mounting bracket fixed to the second housing, wherein the first mounting bracket and the second mounting bracket are configured to mount the server chassis to a server rack.

20. The server chassis of claim 18, wherein each of the first retaining bars of the pair of retaining bars comprises a sheet of rigid material bent back on itself to form the first groove, and wherein the second retaining bar comprises a sheet of rigid material with a bend at each edge of the main portion to form each of the plurality of second grooves.

* * * * *